United States Patent [19]

Terranova et al.

[11] 4,095,145
[45] June 13, 1978

[54] DISPLAY OF VARIABLE LENGTH VECTORS

[75] Inventors: A. P. Terranova, North Andover; F. J. Murphy, Billerica, both of Mass.

[73] Assignee: The United States of America as represented by the Secretary of the Army, Washington, D.C.

[21] Appl. No.: 750,107

[22] Filed: Dec. 13, 1976

[51] Int. Cl.² .......................................... H01J 29/52
[52] U.S. Cl. ................................. 315/383; 315/386; 340/324 A; 364/815; 364/818; 364/424
[58] Field of Search ............... 315/365, 379, 380, 383, 315/384, 385, 386; 343/5 EM; 358/137, 180, 243; 340/324 A; 235/198

[56] References Cited

U.S. PATENT DOCUMENTS

| | | | |
|---|---|---|---|
| 3,488,483 | 1/1970 | Freedman | 340/324 A |
| 3,725,897 | 4/1973 | Bleiweiss | 340/324 A |
| 3,869,085 | 3/1975 | Green | 235/198 |
| 3,976,991 | 8/1976 | Hickin et al. | 235/198 |
| 4,001,806 | 1/1977 | Sweeting | 340/324 A |
| 4,032,768 | 6/1977 | Rieger | 340/324 A |

Primary Examiner—S. C. Buczinski
Attorney, Agent, or Firm—Nathan Edelberg; Robert P. Gibson; Freddie M. Bush

[57] ABSTRACT

A variable length vector display system allows visual indication of the speed and direction of aircraft or moving vehicles, maintaining a constant illumination on the face of a cathode ray tube independent of the vector length or vector movement. The vector length from the target vehicle coordinate points to the predicted intercept coordinate points are displayed. Voltages defining the origin and the end point of a vector to be displayed are coupled through respective comparator and arithmetic units, scaled to provide a deflection factor, multiplied, and coupled through respective controlled integrator circuits. The integrators are controlled by a variable gate which operates as a function of the input signal, thereby varying the on-off time of the integrators for simultaneous operation. Output signals from the integrator circuits are coupled to respective X and Y deflection circuits of a cathode ray tube load. In conjunction with the input zero reference or origin signal the signals are combined to provide the appropriate X and Y deflection potential for the tube.

6 Claims, 1 Drawing Figure

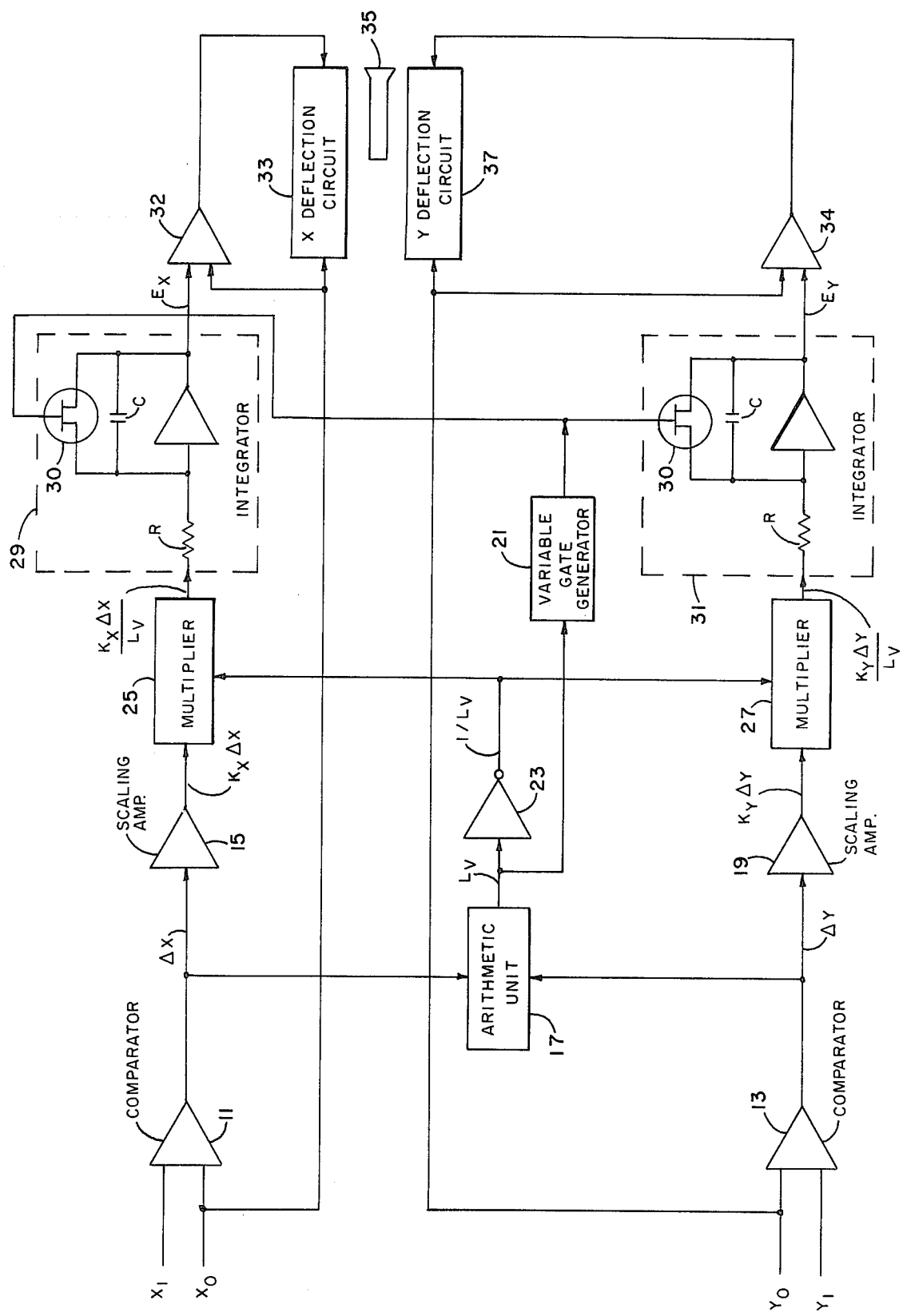

DISPLAY OF VARIABLE LENGTH VECTORS

DEDICATORY CLAUSE

The invention described herein was made under a contract with the Government and may be manufactured, used, and licensed by or for the Government for governmental purposes without the payment to us of any royalties thereon.

BACKGROUND OF THE INVENTION

Display systems often face the problem of painting a vector between any two points on a cathode ray tube screen. Depending on characteristics such as, time available to draw the vector, the refresh rate of the vector, the rate of change of the orientation of the vector, tube characteristics, and vector length; it is possible to get serious variations in intensity levels for individual vectors. The long vector being plotted may be hard to discern, while the short vector may exceed the safe operating point for the tube. In prior art systems, a simple charging voltage proportional to the X and Y coordinates of the vector is applied to integrators which are controlled by a fixed gate generator. Such a system can result in serious variations in writing speed and illumination intensity.

SUMMARY OF THE INVENTION

The variable length vector display system maintains a constant cathode ray tube illumination intensity when writing a vector of any length on the viewing screen of the cathode ray tube. The linear sweep outputs of X and Y operational amplifier sweep generators, integrators, are controlled by a variable gate generator which operates as a function of the combined coordinate input signal voltages to provide a vector length display having substantially uniform writing speed and illumination intensity.

BRIEF DESCRIPTION OF THE DRAWINGS

The single FIGURE is a preferred embodiment of the variable length vector control circuit shown partially in block diagram and partially in schematic.

DESCRIPTION OF THE PREFERRED EMBODIMENT

Referring to the drawing, a first pair of input voltages $X_0$ and $X_1$, are applied to the input terminals of a comparator 11; and, a second pair of input voltages $Y_0$ and $Y_1$, are applied to the input terminals of a comparator 13. These input voltages may come from a conventional radar receiver and may, for example, be indicative of the speed and direction of an aircraft. Voltages $X_0$ and $Y_0$ define the origin or start point of a vector to be displayed, while voltages $X_1$ and $Y_1$ define the end point, or head, of the vector to be displayed. The output signals from comparators 11 and 13 are $\Delta X$ and $\Delta Y$ and represent the difference between the respective input voltages. Thus, $\Delta X = X_1 - X_0$ and $\Delta Y = Y_1 - Y_0$. The $\Delta X$ signal is simultaneously applied to a scaling amplifier 15 and to an arithmetic unit 17. The $\Delta Y$ signal is simultaneously appled to a scaling amplifier 19 and to arithmetic unit 17. Arithmetic unit 17 is of conventional design and may include, for example, voltage multipliers employing feedback for forming an output signal, $L_v$, indicative of the square root of the sum of the squares of the input signals. Thus, $L_v = \sqrt{\Delta X^2 + \Delta Y^2}$. The output signal from arithmetic unit 17 is coupled directly to a variable gate generator 21 and, is coupled by way of an invertor 23, to multipliers 25 and 27.

Scaling amplifiers 15 and 19 simply modify the input signals by a constant, K, which is a deflection factor. Thus, the output signals from scaling amplifiers 15 and 19 are $K_x\Delta X$ and $K_y\Delta Y$. It follows, therefore, that the output signals from multipliers 25 and 27 are, respectively, $K_x\Delta/l_v$ and $K_y\Delta Y/L_v$. These signals are applied to respective integrators 29 and 31 whose integration time is controlled by variable gate generator 21 operating respective unijunction transistors 30 coupled across integrating amplifiers and capacitors C. The output signal from integrator 29 is applied to the deflection circuit 33 of a display tube 35, while the output signal from integrator 31 is applied to the deflection circuit 37 of tube 35. The coordinate voltages $X_0$ and $Y_0$ of the origin of the vector to be displayed are applied to deflection circuits 33 and 37 respectively. In response to the voltage input signals, the circuit is effective to control the intensity of the display on display tube 35 regardless of the length of the vector displayed. Prior art systems would simply apply a charging voltage, proportional to $\Delta X$ and $\Delta Y$, to integrators 29 and 31 which would be under the control of a fixed gate generator. Such prior art systems can result in serious variations in writing speed and illumination intensity.

Deflection circuits 33 and 37 may be electrostatic or electromagnetic deflection means, such as deflection plates or deflection coils, as is well established in the art. Summing amplifiers 32 and 34 are coupled to receive the outputs from integrators 29 and 31 respectively and to receive the respective $X_0$ and $Y_0$ inputs coupled to the deflection circuits for developing the respective deflection voltages across the tube 35. The effective writing speed ($WS_{EFF}$) on the face of tube 35 is a function of the individual writing speeds in the X and Y direction. Thus, $$WS_{EFF} = \sqrt{(WS_x)^2 + (WS_y)^2}. \qquad (1)$$

Assuming linearity and unity gain in the deflection system, the individual writing speeds $WS_x$ and $WS_y$ are directly related to the sweep integrator slope. Thus, $$WS_x = \frac{K_x \Delta X}{RC} \text{ and } WS_y = \frac{K_y \Delta Y}{RC}. \qquad (2)$$

$K_x$, $K_y$, R, and C are known constants, therefore the writing speeds in the X and Y directions are directly proportional to $\Delta X$ and $\Delta Y$, and the effective writing speed is proportional to the vector length $L_v$, where $$L_v = \sqrt{(\Delta X)^2 + (\Delta Y)^2}. \qquad (3)$$

Rearranging terms and defining or limiting $K_x = K_y = K$, it is apparent that $$WS_{EFF} = \frac{K}{RC} L_v. \qquad (4)$$

By solving equation 3, the compensation factor $L_v$ is obtained from arithmetic unit 17 which corrects for writing speed variations. The respective X and Y charging voltages are multiplied by the inverse of this factor $(1/L_v)$ so that the new writing speeds become $$WS_x = \frac{K_x \Delta X}{L_v RC} \text{ and } WS_y = \frac{K_y \Delta Y}{L_v RC} \quad (5)$$

and, therefore, substituting equation 5 into 1, it is apparent that $$WS_{EFF} = \frac{K}{RC} \text{ is a constant.} \quad (6)$$

The vector length $L_v$, calculated by arithmetic unit 17, is applied as an input to variable gate generator 21 wherein it is used to control the integration time of integrators 29 and 31. The total integration time $\Delta t^1$ is, therefore, $\Delta t^1 = \Delta t l_v$ where $\Delta t$ is initially set for some minimum length vector. Thus, the voltages out of integrators 29 and 31 are, respectively, $$E_x = \frac{K_x \Delta X}{RC} \Delta t, \text{ and } E_y = \frac{K_y \Delta Y}{RC} \Delta t.$$

Thus the sweep generator output voltages supply the appropriate variable X and Y vector length signals and the sweep generators or integrators are variably controlled to provide uniform writing speed and illumination intensity of the cathode ray tube.

Although a particular embodiment and form of this invention has been illustrated, it is apparent that various modification and embodiments of the invention may be made by those skilled in the art without departing from the scope and spirit of the foregoing disclosure. Accordingly, the scope of the invention should be limited only by the claims appended hereto.

We claim:

1. A variable length vector display circuit comprising: a cathode ray tube having X deflection means and Y deflection means; first and second comparators each having first and second inputs disposed to receive input voltage signals and an output; first and second operational amplifier sweep generators each having an input, an output, and a control input; the input of said first sweep generator being coupled to the output of said first comparator and the input of said second sweep generator being coupled to the output of said second comparator, the output of said first sweep generator being coupled to the X deflection means of said cathode ray tube and the output of said second sweep generator being coupled to the Y deflection means of said cathode ray tube; an arithmetic unit having first and second inputs and an output, said first input being connected to the output of said first comparator and said second input being connected to the output of said second comparator; a variable gate generator having an input coupled to the output of said arithmetic unit and an output coupled to the respective control inputs of said sweep generators for gating said sweep generators to controllably vary the sweep output voltage of said generators coupled to said deflection means.

2. A variable length vector display circuit as set forth in claim 1 wherein said first input of said first comparator is coupled to provide a second input signal to said X deflection means and said first input of said second comparator is coupled to provide a second input to said Y deflection means.

3. A variable length vector display circuit as set forth in claim 2 and further comprising an inverter having an input and an output, said input being coupled to the output of said arithmetic unit; first and second multiplier circuits having first and second inputs and an output, the output of said inverter being coupled as said first inputs of said first and second multipliers, the outputs of said first and second comparators being coupled to the second inputs respectively of said first and second multipliers, and the outputs of said first and second multipliers being coupled to the inputs of said first and second sweep generators respectively.

4. A variable length vector display circuit as set forth in claim 3 wherein said sweep generators are integrating circuits and further comprising first and second amplifiers coupled between the output of said first and second comparators respectively and the second inputs of said first and second multipliers respectively for scaling the voltage signals coupled therebetween.

5. A variable length vector display circuit as set forth in claim 4 and further comprising a unijunction transistor coupled across each of said integrator circuits, said unijunction switches being emitter coupled to the control input coupled to said variable gate generator for simultaneously activating and de-activating said integrators.

6. A variable length vector display circuit as set forth in claim 5 and further comprising first and second summing amplifiers coupled respectively between the outputs of said integrating circuits and the inputs to said deflection means, each of said summing amplifiers having a first input coupled to receive said respective integrating circuit outputs, an output coupled to respective deflection circuits, and a second input coupled to receive respective of said second input signals to said deflection means coupled from said comparator inputs.

* * * * *

UNITED STATES PATENT AND TRADEMARK OFFICE
CERTIFICATE OF CORRECTION

PATENT NO. : 4,095,145
DATED : June 13, 1978
INVENTOR(S) : A. P. Terranova and F. J. Murphy It is certified that error appears in the above-identified patent and that said Letters Patent are hereby corrected as shown below:

Column 2, line 9, change "$K_x \Delta / l_v$" to read — $K_x \Delta X / L_v$ —; and Column 3, line 15, change "$\Delta t^1 = \Delta t l_v$" to read — $\Delta t^1 = \Delta t L_v$ —.

Signed and Sealed this

Twenty-sixth Day of December 1978

[SEAL]

Attest:

RUTH C. MASON
*Attesting Officer*

DONALD W. BANNER
*Commissioner of Patents and Trademarks*